(12) United States Patent
Katase et al.

(10) Patent No.: US 11,476,756 B2
(45) Date of Patent: Oct. 18, 2022

(54) PULSE WIDTH MODULATION CIRCUIT

(71) Applicant: SEIKO EPSON CORPORATION, Tokyo (JP)

(72) Inventors: Makoto Katase, Azumino (JP); Haruo Hayashi, Shiojiri (JP); Motoaki Nishimura, Chino (JP); Yusuke Sano, Shiojiri (JP); Yoshifumi Sakamoto, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 78 days.

(21) Appl. No.: 17/081,281

(22) Filed: Oct. 27, 2020

(65) Prior Publication Data

US 2021/0126530 A1 Apr. 29, 2021

(30) Foreign Application Priority Data

Oct. 29, 2019 (JP) .............................. JP2019-195846

(51) Int. Cl.
*H02M 3/156* (2006.01)
*G01R 19/165* (2006.01)
*H03K 5/24* (2006.01)
*H02M 1/00* (2006.01)

(52) U.S. Cl.
CPC ...... *H02M 3/156* (2013.01); *G01R 19/16538* (2013.01); *H03K 5/24* (2013.01); *H02M 1/0025* (2021.05); *H02M 1/0041* (2021.05)

(58) Field of Classification Search
None
See application file for complete search history.

(56) References Cited

U.S. PATENT DOCUMENTS 6,979,984 B2 * 12/2005 Perrier ................... G05F 1/575
                                                        323/281
7,764,057 B2 *  7/2010 Groom .................. H02M 3/156
                                                        323/283
9,141,161 B2 *  9/2015 Rolland ................ H02M 3/157
9,164,520 B2 * 10/2015 Miyazaki ................. G05F 1/10
9,998,004 B2 *  6/2018 Sicard ................... H02M 3/156

FOREIGN PATENT DOCUMENTS

JP          2014-166037          9/2014

* cited by examiner

*Primary Examiner* — Jeffrey A Gblende
(74) *Attorney, Agent, or Firm* — Rankin, Hill & Clark LLP

(57) ABSTRACT

A circuit device includes a pulse signal output circuit and a driving circuit. The pulse signal output circuit, when a detection voltage has decreased below a reference voltage, changes a pulse signal to an active level at which a switching element is turned on. The pulse signal output circuit, after the detection voltage has decreased below the reference voltage, performs monitoring as to whether or not the detection voltage has exceeded the reference voltage, and upon detecting that the detection voltage has exceeded the reference voltage, changes the pulse signal to an inactive level at which the switching element is turned off. The driving circuit outputs a driving signal based on the pulse signal to the switching element.

19 Claims, 7 Drawing Sheets

PULSE WIDTH MODULATION CIRCUIT

The present application is based on, and claims priority from JP Application Serial Number 2019-195846, filed Oct. 29, 2019, the disclosure of which is hereby incorporated by reference herein in its entirety.

BACKGROUND

1. Technical Field

The present disclosure relates to a circuit device, a power supply device, an electronic apparatus, and the like.

2. Related Art

A method of feedback by performing PWM control using an error amplifier, a method of feedback by performing hysteresis control using a comparator, and the like are known as control methods of a switching power supply. The PWM control is one type of linear control, and the hysteresis control is one type of nonlinear control.

JP-A-2014-166037 discloses a power supply control circuit that performs bottom detection hysteresis control. The power supply control circuit disclosed in JP-A-2014-166037 keeps the output of a switching power supply at a constant voltage by controlling a main switch of the switching power supply based on the output voltage of the switching power supply. Specifically, the power supply control circuit includes a comparator, a pulse generation circuit, and a driving signal generation circuit, and when the comparator detects that the output voltage has decreased below a lower limit voltage, the pulse generation circuit changes a control pulse to an active level for a fixed time, and the driving signal generation circuit turns on the main switch for a given time based on the control pulse.

In JP-A-2014-166037, the on time of the main switch of the switching power supply is fixed, and therefore the on time of the main switch is fixed regardless of the load, and there is a problem in that optimum feedback control is not performed according to the load.

SUMMARY

An aspect of the present disclosure relates to a circuit device including: a pulse signal output circuit configured to perform comparison between a detection voltage and a reference voltage, the detection voltage being based on an output voltage or an output current of a power supply circuit that supplies power to a load through a switching element to which an input voltage is input, and output a pulse signal based on a result of the comparison; and a driving circuit configured to output a driving signal based on the pulse signal to the switching element, wherein the pulse signal output circuit, when the detection voltage has decreased below the reference voltage, changes the pulse signal to an active level at which the switching element is turned on, and after the detection voltage has decreased below the reference voltage, performs monitoring as to whether or not the detection voltage has exceeded the reference voltage, and upon detecting that the detection voltage has exceeded the reference voltage, changes the pulse signal to an inactive level at which the switching element is turned off.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

Hereinafter, preferred embodiments of the disclosure will be described in detail. Note that the embodiments given below are not intended to unduly limit the scope of the disclosure recited in the appended claims. In addition, not all of the constituent elements described below are essential to the disclosure.

1. Circuit Device and Power Supply Device

Figure 1:
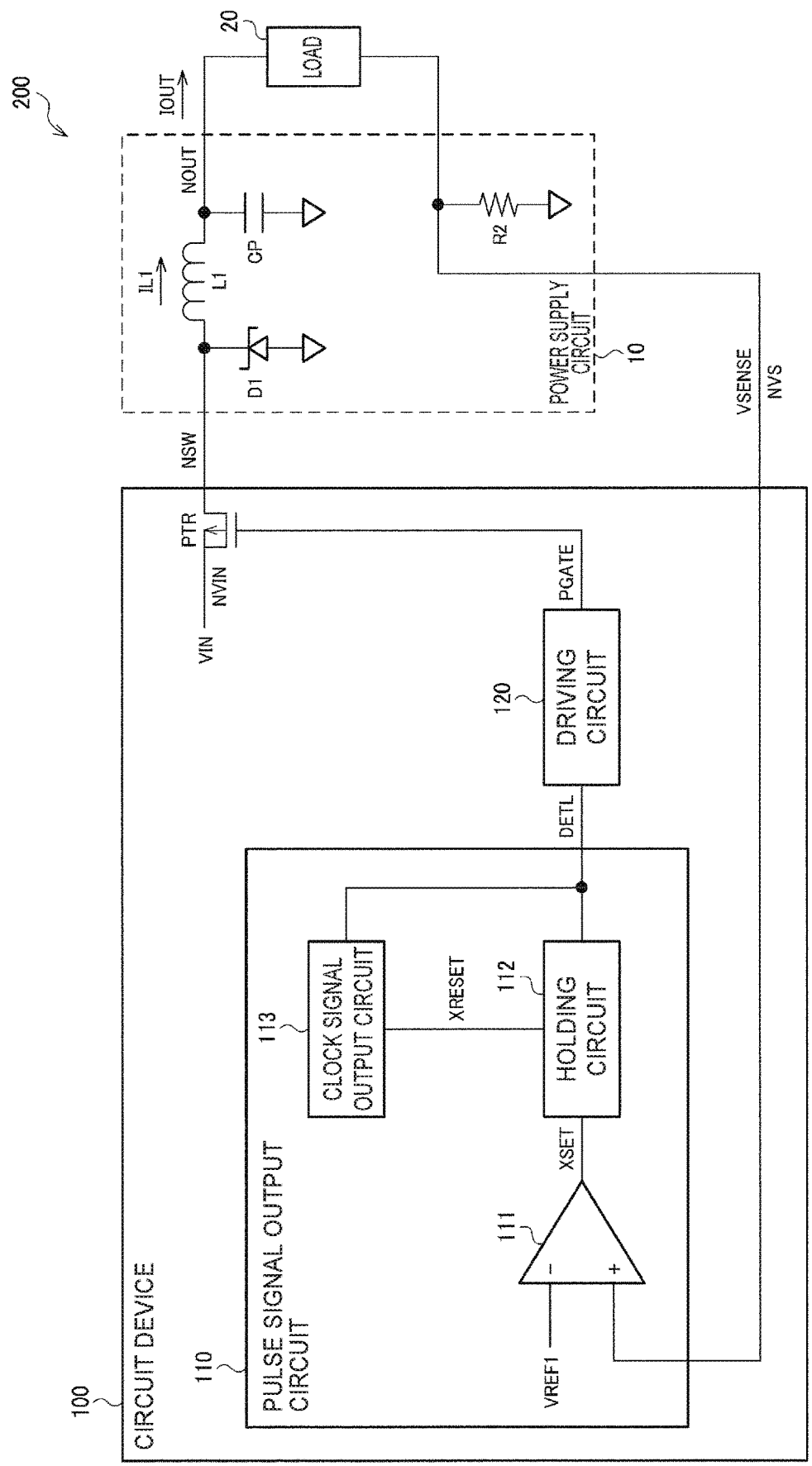
FIG. 1 shows an exemplary configuration of a circuit device and a power supply device including the circuit device.

FIG. 1 shows an exemplary configuration of a circuit device 100 and a power supply device 200 including the circuit device 100 of the present embodiment. The power supply device 200 includes the circuit device 100 and a power supply circuit 10. The circuit device 100 includes a pulse signal output circuit 110, a driving circuit 120, and a transistor PTR, which is a switching element.

The circuit device 100 is an integrated circuit device that is called an IC (Integrated Circuit). For example, the circuit device 100 is an IC manufactured by a semiconductor process, and is a semiconductor chip in which circuit elements are formed on a semiconductor substrate. The power supply circuit 10 is provided outside the circuit device 100, which is an integrated circuit device. Note that the transistor PTR is included in the circuit device 100 in FIG. 1, but the transistor PTR may be included in the power supply circuit 10.

The power supply circuit 10 supplies power to a load 20 based on an input voltage VIN. In FIG. 1, a case is described where the power supply circuit 10 generates a constant output current IOUT from an input voltage VIN, and output the output current IOUT to the load 20 for supplying power. Note that, as will be described later, the power supply circuit 10 may DC/DC-convert the input voltage VIN to a constant output voltage, and output the output voltage to the load 20 for supplying power. The power supply circuit 10 includes an inductor L1, a diode D1, a capacitor CP, and a resistor R2. Note that the power supply circuit 10 functions as a switching power supply when the transistor PTR is included as the constituent element, and therefore the power supply circuit 10 and the transistor PTR will be described here.

The transistor PTR is a P-type transistor. The source of the transistor PTR is connected to a node NVIN to which the input voltage VIN is input, and the drain thereof is connected to a node NSW. The input voltage VIN may be internally generated in the circuit device 100, or may be supplied from the outside of the circuit device 100. A driving signal PGATE is input to the gate of the transistor PTR, and the transistor PTR turns on or off based on the driving signal PGATE. Note that the transistor PTR is not limited to a P-type transistor, and may also be an N-type transistor.

One end of the inductor L1 is connected to the node NSW, and the other end is connected to a node NOUT. The anode of the diode D1 is connected to ground, and the cathode is connected to the node NSW. The diode D1 is a switching diode, for example. One end of the capacitor CP is connected to the node NOUT, and the other end is connected to ground. One end of the load 20 is connected to the node NOUT, and the other end is connected to a node NVS. The load 20 need only be any element/component through which current flows. For example, the load 20 may be a circuit, or may also be a substance that allows current to path, such as water. One end of the resistor R2 is connected to the node NVS, and the other end is connected to ground.

When the transistor PTR is ON, the input voltage VIN is applied to the one end of the inductor L1 through the transistor PTR, and a current IL1 that flows through the inductor L1 increases. When the transistor PTR is OFF, the one end of the inductor L1 is connected to ground through the diode D1, and the current IL1 that flows through the inductor L1 decreases. The capacitor CP is for smoothing the current output from the inductor L1, and the smoothed current is the output current IOUT.

The output current IOUT flows to the ground through the load 20 and the resistor R2, and is converted to a detection voltage VSENSE by the resistor R2. The one end of the resistor R2 is connected to the pulse signal output circuit 110 at the node NVS, and the detection voltage VSENSE is input to the pulse signal output circuit 110 through the node NVS.

The pulse signal output circuit 110 outputs a pulse signal DETL based on the detection voltage VSENSE, and the driving circuit 120 outputs the driving signal PGATE to the gate of the transistor PTR based on the pulse signal DETL. With this feedback loop, feedback control is performed such that the detection voltage VSENSE is to be constant. With this, feedback control is performed such that the output current IOUT is to be constant. In the following, the pulse signal output circuit 110 and the driving circuit 120 will be described.

Figure 2:
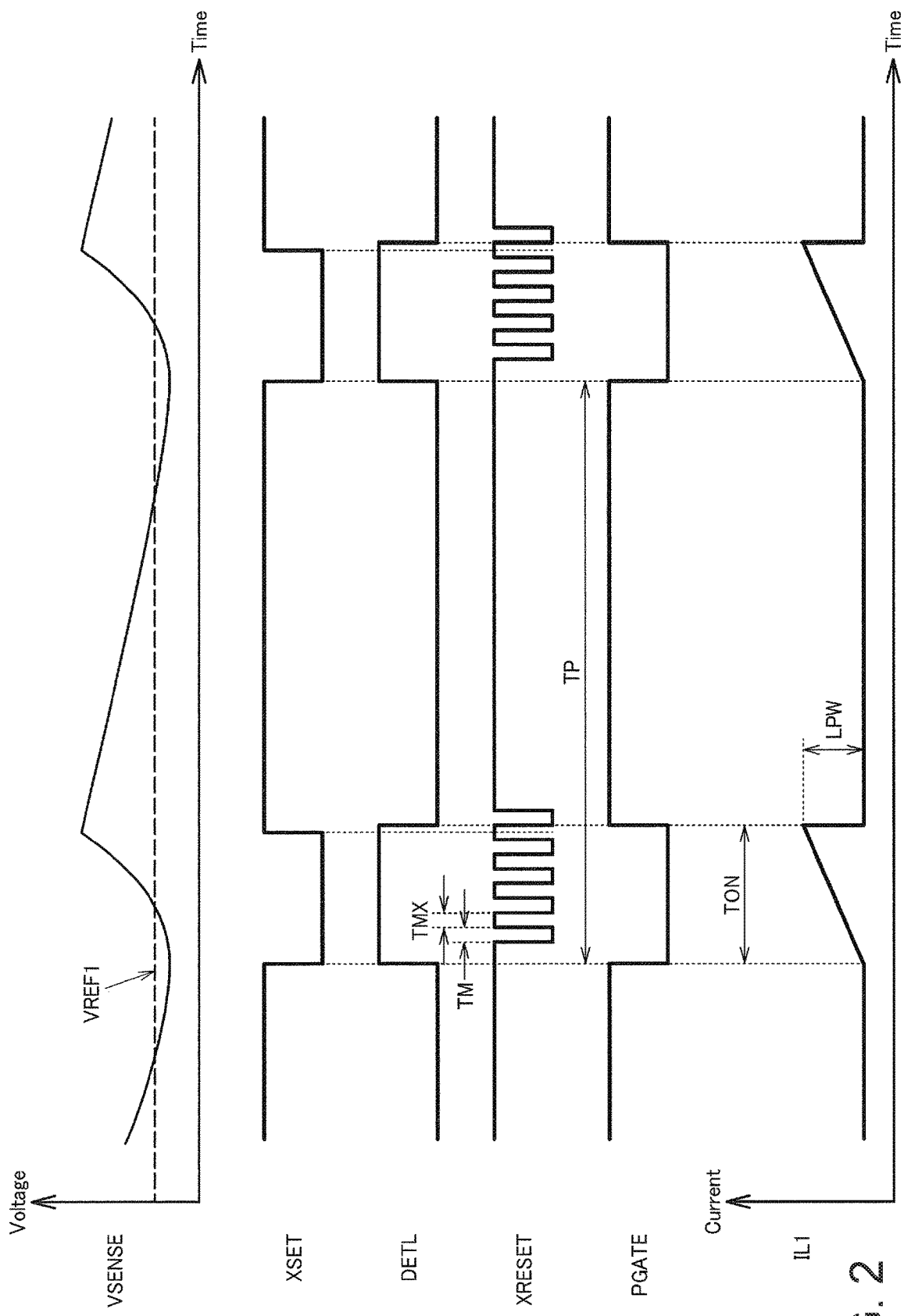
FIG. 2 is a waveform diagram for illustrating the operations of a pulse signal output circuit and a driving circuit.

FIG. 2 is a waveform diagram for illustrating the operations of the pulse signal output circuit 110 and the driving circuit 120.

The pulse signal output circuit 110 compares the detection voltage VSENSE with a reference voltage VREF1, and outputs the pulse signal DETL based on the comparison result. Specifically, when the detection voltage VSENSE has decreased below the reference voltage VREF1, the pulse signal output circuit 110 changes the pulse signal DETL from a low level to a high level. In FIG. 2, the timing at which the pulse signal DETL changes from a low level to a high level is delayed from the timing at which the detection voltage VSENSE has decreased below the reference voltage VREF1. This delay is caused by a response time of the circuit. For example, the delay is caused by the response time of the comparator 111, which will be described later. In the pulse signal DETL in FIG. 2, the high level is an active level at which the transistor PTR is ON, and the low level is an inactive level at which the transistor PTR is OFF. Note that the correspondence relationship between the logic level and the active level is not limited hereto.

The pulse signal output circuit 110, after the detection voltage VSENSE has decreased below the reference voltage VREF1, performs monitoring as to whether or not the detection voltage VSENSE has exceeded the reference voltage VREF1. The pulse signal output circuit 110, upon detecting the detection voltage VSENSE has exceeded the reference voltage VREF1 in the monitoring, changes the pulse signal DETL from a high level to a low level.

The driving circuit 120 outputs a signal obtained by inverting the logic level of the pulse signal DETL as the driving signal PGATE. Also, the power supply voltage of the pulse signal output circuit 110 is a voltage lower than the input voltage VIN. Therefore, the driving circuit 120 outputs the driving signal PGATE by level-shifting the pulse signal DETL while performing logical inversion. The length of a period in which the driving signal PGATE is at a low level and the transistor PTR is ON is denoted as an on time TON of the transistor PTR. In the present embodiment, the length of a period in which the pulse signal DETL is at the active level changes according to the monitoring result, and therefore the on time TON of the transistor PTR changes according to the load. Also, when the cycle of the transistor PTR being turned on is denoted as an on cycle TP, the on cycle TP also changes according to the load.

According to the present embodiment, as a result of performing bottom detection hysteresis control, fast response to the change in load is possible relative to linear control using an error amplifier. Also, the on time TON of the transistor PTR can be adaptively changed according to the load, and therefore the circuit device 100 can perform optimum feedback control on the power supply circuit 10, compared with a method in which the on time is fixed.

Specifically, when the on time of a switching element is fixed, as in JP-A-2014-166037, the on cycle of the switching element changes according to the change in the load. For example, when the load is low, the output of the switching power supply decreases by increasing the on cycle. That is, since the on time is fixed, the change in load is handled with only the change in the on cycle, and therefore the change in the on cycle increases. In the present embodiment, since the on time TON is variable, when the load is low, the on time TON decreases, and when the load is high, the on time TON increases. Accordingly, the change in the on cycle TP decreases relative to the change in load, compared with the cases where the on time is fixed. The on cycle TP corresponds to the feedback cycle, and therefore even in a case where the load is low, the feedback cycle can be kept at an appropriate cycle.

Also, in the on time of the switching element, the current flowing through the inductor increases at a fixed slope, and therefore the ripple amplitude is proportional to the on time. Therefore, when the on time of the switching element is fixed, the amplitude of the ripple that the switching power supply generates is fixed regardless of the load. When the load is low, the ripple relatively increases in spite of the fact that the output of the switching power supply is small. In the present embodiment, since the on time TON is variable, the ripple LPW is also variable. In FIG. 2, the ripple LPW in the current IL1 flowing through the inductor L1 is shown. When the load is low, the on time TON decreases, and therefore the amplitude of the ripple LPW decreases relative to the case where the on time is fixed, and stable power is supplied to the load.

Also, when the on time of the main switch is fixed, an off time inevitably occurs, and therefore the duty ratio of the on time cannot be set to 100% even in a case where the load is high. That is, power cannot be continuously supplied to the load. In the present embodiment, whether or not the detection voltage VSENSE exceeds the reference voltage VREF1 is monitored, and therefore the pulse signal DETL will not change to the inactive level unless the detection voltage VSENSE exceeds the reference voltage VREF1. That is, when the load is high so that the detection voltage VSENSE will not exceed the reference voltage VREF1, the transistor PTR is kept to be ON, and the power can be continuously supplied to the load.

Hereinafter, a detailed exemplary configuration of the pulse signal output circuit 110 will be described. As shown in FIG. 1, the pulse signal output circuit 110 includes the comparator 111, a holding circuit 112, and a clock signal output circuit 113.

The comparator 111 compares the detection voltage VSENSE with the reference voltage VREF1, and output the comparison result as a comparison result signal XSET. As shown in FIG. 2, the comparator 111 outputs the comparison result signal XSET at a high level when the detection voltage VSENSE is higher than the reference voltage VREF1, and outputs the comparison result signal XSET at a low level when the detection voltage VSENSE is lower than the reference voltage VREF1.

Note that, since a delay occurs due to the response time of the comparator 111, the timing at which the detection voltage VSENSE matches the reference voltage VREF1 differs from the timing at which the comparison result signal XSET transitions.

The clock signal output circuit 113 outputs a monitoring clock signal XRESET. As shown in FIG. 2, the clock signal output circuit 113 starts outputting of the monitoring clock signal XRESET when the pulse signal DETL changes from a low level to a high level, and ends outputting of the monitoring clock signal XRESET when the pulse signal DETL changes from a high level to a low level.

Note that the clock signal output circuit 113, after ending outputting of the monitoring clock signal XRESET, returns the monitoring clock signal XRESET from a low level to a high level. That is, the clock signal output circuit 113 ends, when the pulse signal DETL changes from a high level to a low level, at least the operation of changing the monitoring clock signal XRESET from a high level to a low level. The timing at which the monitoring clock signal XRESET changes from a high level to a low level corresponds to a start timing of a monitoring period, which will be described later.

The holding circuit 112 performs a holding operation of holding the pulse signal DETL based on the comparison result signal XSET and the monitoring clock signal XRESET. The holding circuit 112 is an SR latch circuit, that is, a set/reset circuit. The comparison result signal XSET is input to a set terminal of the set/reset circuit, and the monitoring clock signal XRESET is input to a reset terminal of the set/reset circuit. The comparison result signal XSET corresponds to a logically inverted signal of the set signal, and the monitoring clock signal XRESET corresponds to a logically inverted signal of the reset signal.

The operations of the holding circuit 112 will be described using FIG. 2. When the comparison result signal XSET is at a high level, the holding circuit 112 is in a set released state. When the comparison result signal XSET changes from a high level to a low level, that is, when the comparator 111 has determined that the detection voltage VSENSE has decreased below the reference voltage VREF1, the holding circuit 112 changes the pulse signal DETL from a low level to a high level. This operation corresponds to the holding circuit 112 entering the set state.

When the pulse signal DETL is at a high level, in a monitoring period TM, the holding circuit 112 determines whether or not the detection voltage VSENSE has exceeded the reference voltage VREF1 by monitoring the comparison result signal XSET. The monitoring period TM is a period in which the monitoring clock signal XRESET is at a low level. The monitoring clock signal XRESET at a low level corresponds to a signal for resetting the holding circuit 112. The period in which the monitoring clock signal XRESET is at a high level is denoted as a non-monitoring period TMX.

When the holding circuit 112 is in a set state, the logic level of the pulse signal DETL does not change regardless of the logic level of the reset signal. That is, when the comparison result signal XSET is at a low level, the pulse signal DETL is kept at a high level in both of the monitoring period TM and the non-monitoring period TMX.

When the comparison result signal XSET changes from a low level to a high level, the holding circuit 112 enters a set released state, and can be reset by the monitoring clock signal XRESET. That is, when the comparison result signal XSET changes from a low level to a high level in a non-monitoring period TMX, the holding circuit 112 is not reset in this non-monitoring period TMX, and the holding circuit 112 is reset when the next monitoring period TM in entered, and the pulse signal DETL changes from a high level to a low level. FIG. 2 illustrates this case. When the comparison result signal XSET changes from a low level to a high level in a monitoring period TM, the holding circuit 112 is reset at this timing, and the pulse signal DETL changes from a high level to a low level. In this way, the holding circuit 112 does not monitor the comparison result signal XSET in the non-monitoring period TMX, and monitors the comparison result signal XSET in the monitoring period TM.

As shown in FIG. 2, when the pulse signal DETL changes from a low level to a high level, the monitoring clock signal XRESET is at a high level, and a non-monitoring period TMX is entered. Therefore, in a period from when the pulse signal DETL changes from a low level to a high level until when the monitoring clock signal XRESET changes to a low level, the holding circuit 112 does not respond to the comparison result signal XSET. This period functions as a hysteresis of the holding circuit 112.

According to the embodiment described above, the clock signal output circuit 113 outputs the monitoring clock signal XRESET at a predetermined cycle, and the pulse signal output circuit 110 monitors the comparison result signal XSET based on the monitoring clock signal XRESET. Specifically, the pulse signal output circuit 110, after the detection voltage VSENSE has decreased below the reference voltage VREF1, repeats the monitoring period TM and the non-monitoring period TMX based on the monitoring clock signal XRESET. The monitoring period TM is repeated at the predetermined cycle of the monitoring clock signal XRESET. This predetermined cycle is shorter than the switching interval of the transistor PTR. In the example in FIG. 2, the switching interval is the on cycle TP, and the predetermined cycle is a sum of lengths of one monitoring period TM and one non-monitoring period TMX.

According to the present embodiment, the comparison result signal XSET can be monitored in the monitoring period TM that is specified by the monitoring clock signal XRESET. With this, when it is detected that the detection voltage VSENSE has increased over the reference voltage VREF1 in the monitoring period TM, the pulse signal DETL changes to the inactive level, and the transistor PTR is turned OFF. Since the monitoring period TM is repeated at the predetermined cycle, the transistor PTR is turned OFF in the first monitoring period TM after the detection voltage VSENSE has increased over the reference voltage VREF1. With this, the on time TON can be variably controlled.

Figure 3:
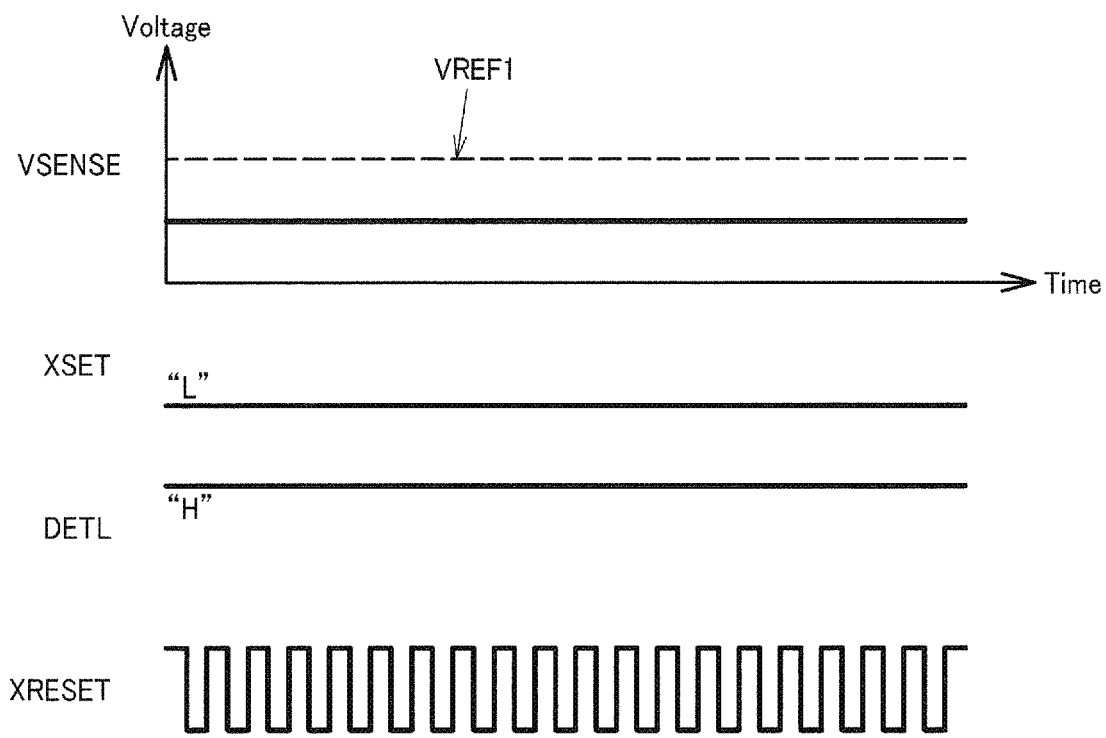
FIG. 3 is a waveform diagram for illustrating continuous power supply.

FIG. 3 is a waveform diagram for illustrating continuous power supply. FIG. 3 shows a waveform diagram when, even if the output current IOUT is continuously caused to flow in a high load, the detection voltage VSENSE remains to be lower than the reference voltage VREF1.

In this case, the comparator 111 continuously outputs the comparison result signal XSET at a low level, and therefore the holding circuit 112 is kept in a set state. Since the pulse signal DETL is at a high level, the clock signal output circuit 113 outputs the monitoring clock signal XRESET, but since the holding circuit 112 is in a set state, the holding circuit 112 is not reset, and the pulse signal DETL is kept at a high level. That is, the transistor PTR is kept to be ON. In this way, in the present embodiment, continuous power supply is possible.

Figure 4:
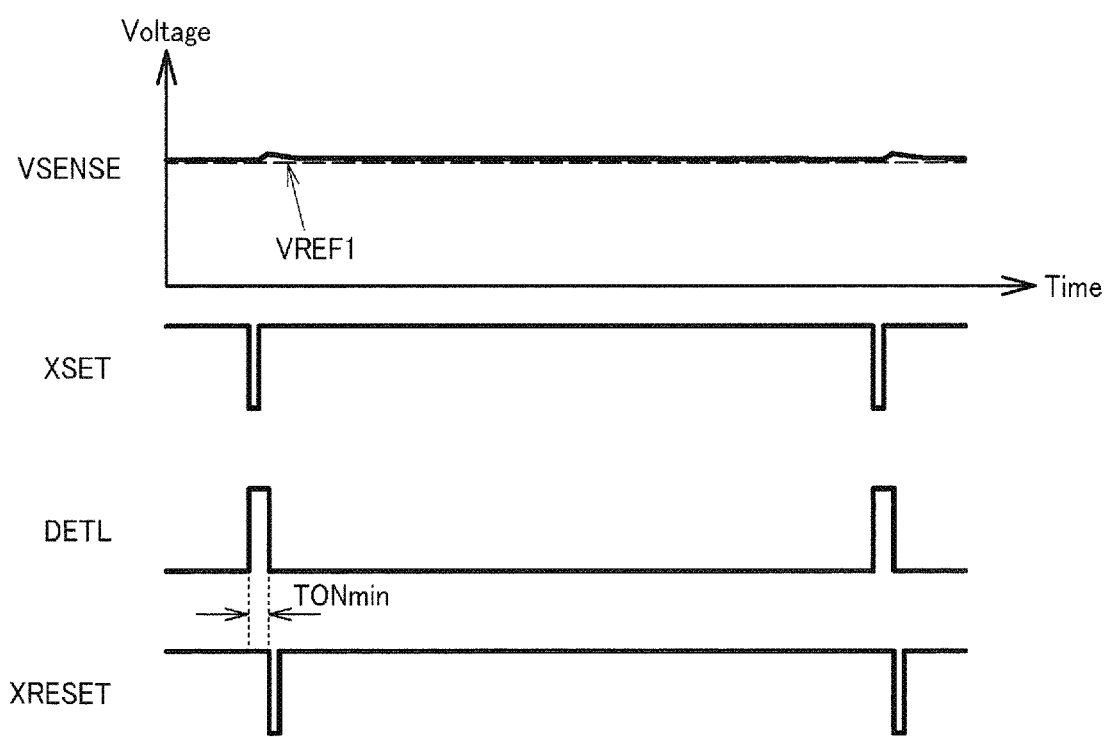
FIG. 4 is a waveform diagram for illustrating a minimum on time.

FIG. 4 is a waveform diagram for illustrating a minimum on time TON. FIG. 4 shows a waveform diagram when the detection voltage VSENSE becomes higher than the reference voltage VREF1 immediately after the transistor PTR being turned ON, in a low load.

In a period TONmin from when the pulse signal DETL changes from a low level to a high level until when the monitoring clock signal XRESET first changes from a high level to a low level, the comparison result signal XSET changes from a low level to a high level. Therefore, when the monitoring clock signal XRESET has first changed from a high level to a low level, the pulse signal DETL changes from a high level to a low level, and the transistor PTR turned OFF from an ON state. The period TONmin is a minimum on time TON, and corresponds to one pulse width of the monitoring clock signal XRESET. In this way, in the present embodiment, the length of the on time TON can be reduced to the one pulse width of the monitoring clock signal XRESET.

As described above, in the present embodiment, the on time TON can be largely changed. With this, it is possible to deal with a load in a wide range, compared with a case where an on time fixed method is adopted.

2. Detailed Exemplary Configuration

Figure 5:
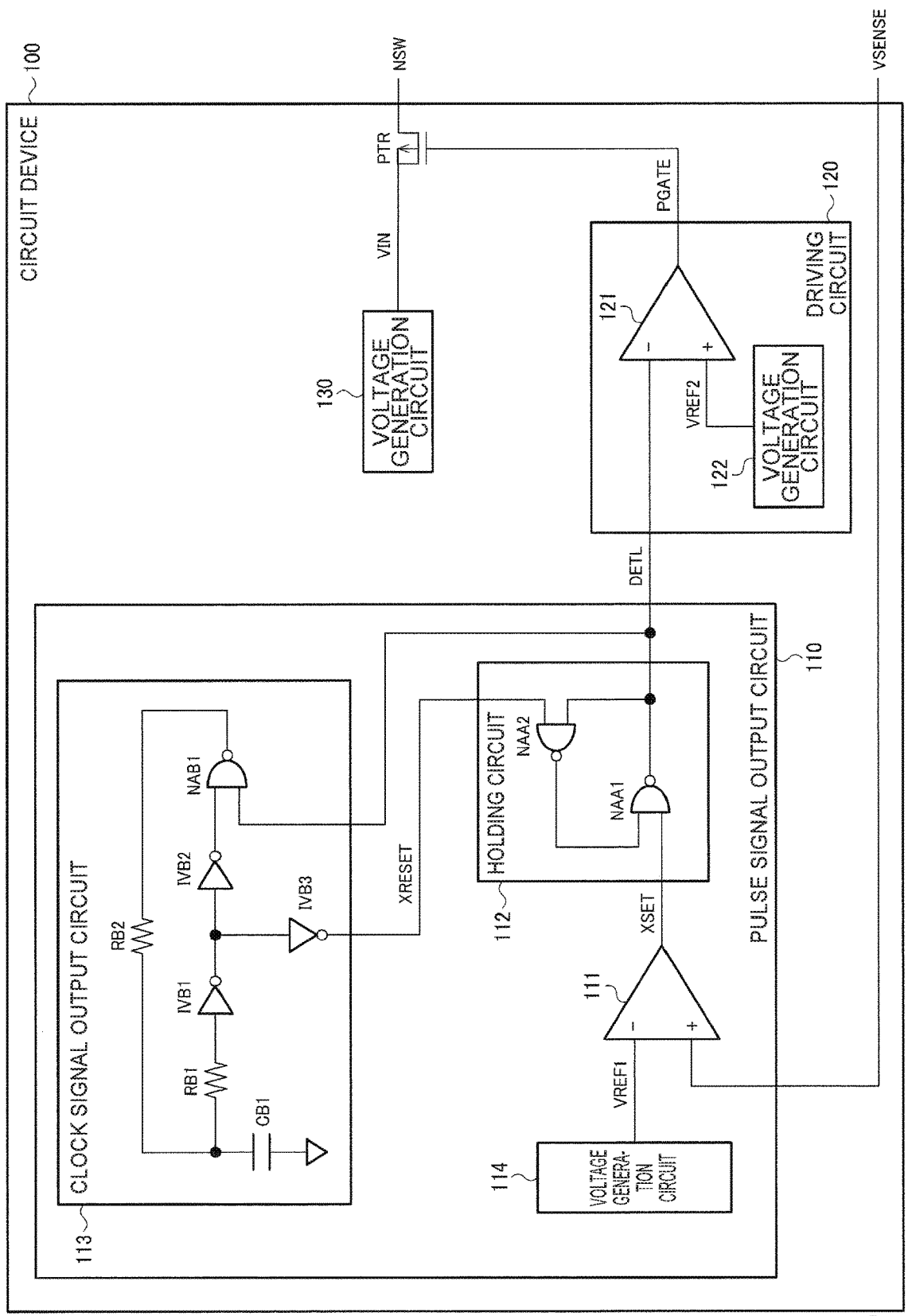
FIG. 5 is a detailed exemplary configuration of the circuit device.

FIG. 5 is a detailed exemplary configuration of the circuit device 100. In the following, the differences from the exemplary configuration in FIG. 1 will be mainly described.

The circuit device 100 further includes a voltage generation circuit 130. The voltage generation circuit 130 generates an input voltage VIN, and outputs the input voltage VIN to the source of the transistor PTR.

The driving circuit 120 includes an amplifier circuit 121 and a voltage generation circuit 122. The voltage generation circuit 122 generates a reference voltage VREF2. The pulse signal DETL is input to the inverting input node of the amplifier circuit 121, and the reference voltage VREF2 is input to the non-inverting input node. When the pulse signal DETL is at a high level, the voltage of the pulse signal DETL is higher than the reference voltage VREF2, and the amplifier circuit 121 outputs the driving signal PGATE at a low level. When the pulse signal DETL is at a low level, the voltage of the pulse signal DETL is lower than the reference voltage VREF2, and the amplifier circuit 121 outputs the driving signal PGATE at a high level. The power supply voltage of the amplifier circuit 121 is higher than the power supply voltage of the pulse signal output circuit 110. That is, the voltage of the driving signal PGATE at a high level is higher than the voltage of the pulse signal DETL at a high level. The amplifier circuit 121 compensates the voltage difference by performing level-shifting.

The pulse signal output circuit 110 further includes a voltage generation circuit 114. The voltage generation circuit 114 generates the reference voltage VREF1, and outputs the reference voltage VREF1 to the inverting input node of the comparator 111.

The holding circuit 112 includes NAND circuits NAA1 and NAA2. The comparison result signal XSET is input to a first input node of the NAND circuit NAA1, and the output signal of the NAND circuit NAA2 is input to a second input node. The monitoring clock signal XRESET is input to a first input node of the NAND circuit NAA2, and the output signal of the NAND circuit NAA1 is input to a second input node. The NAND circuits NAA1 and NAA2 constitute an SR latch circuit. The first input node of the NAND circuit NAA1 corresponds to the set terminal, and the first input node of the NAND circuit NAA2 corresponds to the reset terminal. The output signal of the NAND circuit NAA1 is the pulse signal DETL.

The clock signal output circuit 113 includes a NAND circuit NAB1, resistors RB1 and RB2, and inverter circuits IVB1, IVB2, and IVB3. The NAND circuit NAB1, the resistor RB2, the resistor RB1, the inverter circuit IVB1, and the inverter circuit IVB2 are connected in a ring shape, and constitute a ring oscillator. One end of the capacitor CB1 is connected to a node between the resistor RB2 and the resistor RB1, and the other end is connected to ground. The resistors RB1 and RB2 and the capacitor CB1 constitute a low pass filter, and relates to the oscillation frequency of the ring oscillator. The inverter circuit IVB3 logically inverts the output signal of the inverter circuit IVB1, and outputs the logically inverted signal as the monitoring clock signal XRESET.

The pulse signal DETL corresponds to an enable signal of the ring oscillator. That is, when the pulse signal DETL is at a low level, the oscillation of the ring oscillator is disabled, and the monitoring clock signal XRESET is fixed to a high level. When the pulse signal DETL is at a high level, the oscillation of the ring oscillator is enabled, and the monitoring clock signal XRESET is output at a predetermined cycle based on the oscillation signal. The predetermined cycle is a cycle corresponding to the oscillation frequency of the ring oscillator.

According to the present embodiment described above, the clock signal output circuit 113 and the holding circuit 112 are constituted by logic circuits, and the power supply voltage thereof is lower than the input voltage VIN and the power supply voltage of the driving circuit 120. The clock signal output circuit 113 and the holding circuit 112 constitute a loop for monitoring the comparison result signal XSET, and as a result of the power supply voltage thereof being lower than the input voltage VIN and the power supply voltage of the driving circuit 120, monitoring is made possible at a low power consumption.

Note that, in FIG. 5, a case has been described where the clock signal output circuit 113 is an oscillator circuit, and the oscillator circuit is a ring oscillator, as an example, but the oscillator circuit is not limited to the ring oscillator. For example, the oscillator circuit may include a capacitor, a current source, a switch, and a judgement circuit. The capacitor and the current source are connected in series, and the capacitor and the switch are connected in parallel. When the switch is off, the current source charges the capacitor, and when the judgement circuit determines that the voltage at one end of the capacitor has reached a judgement voltage, the switch is turned on, and the capacitor is discharged. As a result of the capacitor being discharged, the voltage at the one end of the capacitor decreases below the judgement voltage, and therefore the switch is turned off. As a result of repeating the above operations, the oscillator circuit performs an oscillation operation.

3. Second Detailed Exemplary Configuration of Clock Signal Output Circuit

A case where the clock signal output circuit 113 outputs the monitoring clock signal XRESET by performing an oscillation operation has been described above, but the monitoring clock signal XRESET may also be a clock signal based on an external clock signal.

Figure 6:
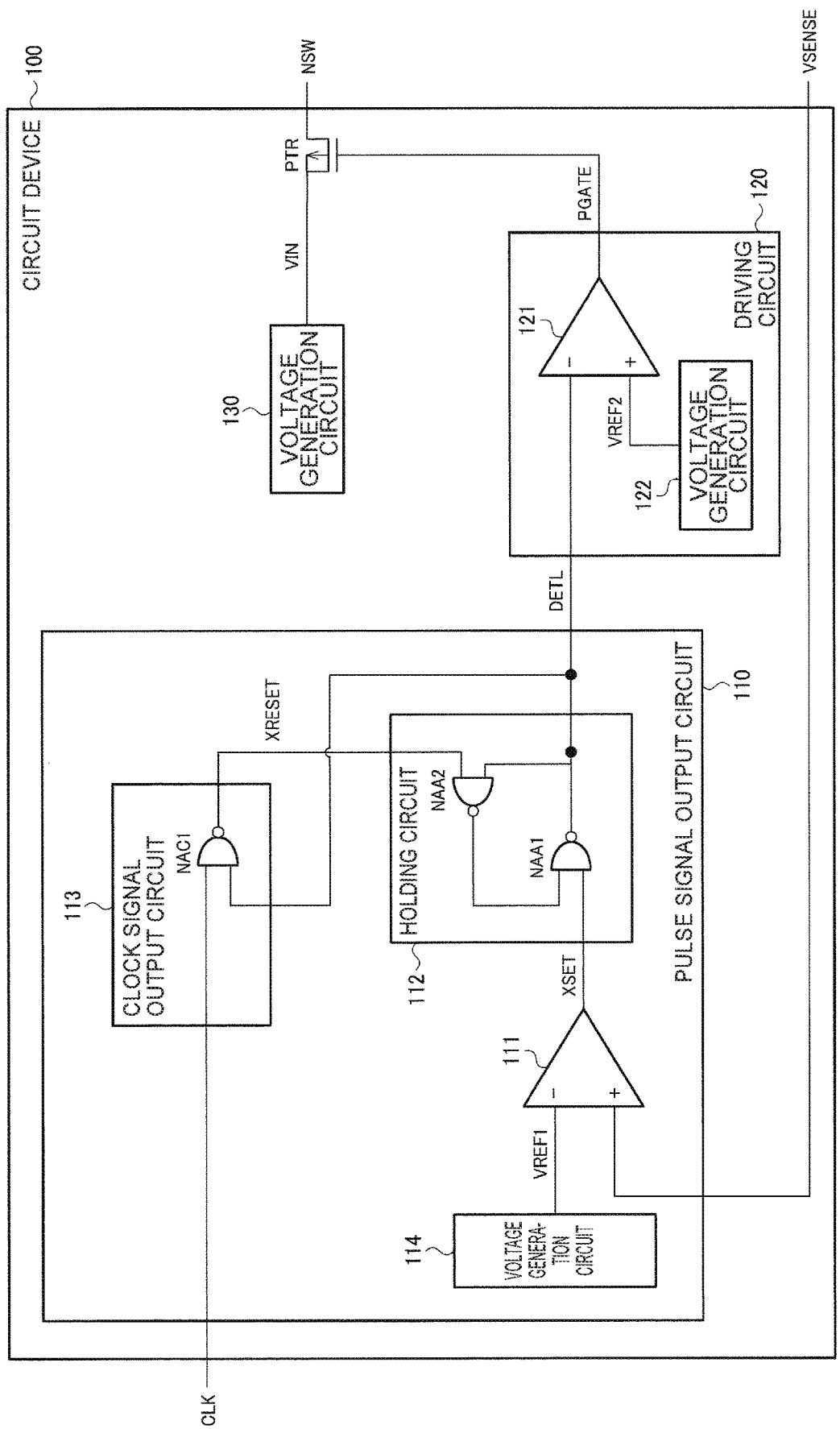
FIG. 6 is a detailed exemplary configuration of a clock signal output circuit when a monitoring clock signal is a clock signal based on an external clock signal.

FIG. 6 is a detailed exemplary configuration of the clock signal output circuit 113 when the monitoring clock signal XRESET is a clock signal based on an external clock signal. The clock signal output circuit 113 includes a NAND circuit NAC1.

Figure 7:
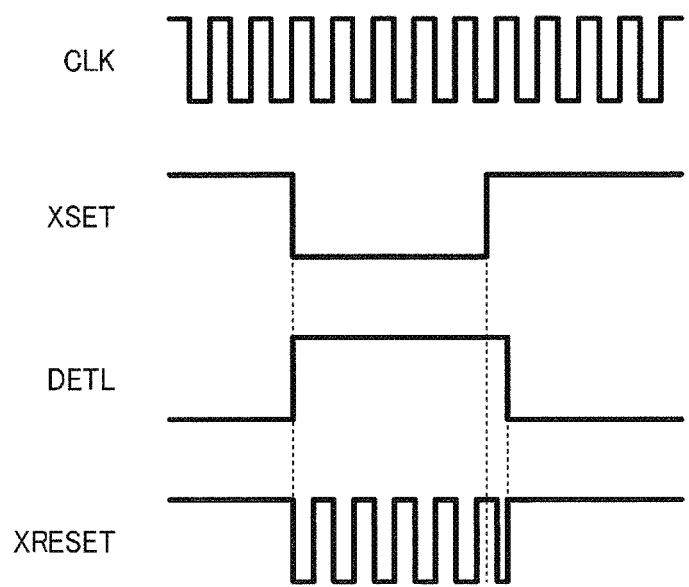
FIG. 7 is a waveform diagram for illustrating the operations of the clock signal output circuit.

A clock signal CLK is input to a first input node of the NAND circuit NAC1 from the outside of the circuit device 100. The pulse signal DETL is input to a second input node of the NAND circuit NAC1. The output signal of the NAND circuit NAC1 is the monitoring clock signal XRESET. FIG. 7 is a waveform diagram for illustrating the operations of the clock signal output circuit 113 in FIG. 6. When the pulse signal DETL is at a low level, the NAND circuit NAC1 outputs a signal at a high level, and therefore the monitoring clock signal XRESET is at a high level. When the pulse signal DETL is at a high level, the NAND circuit NAC1 logically inverts the clock signal CLK, and outputs the logically inverted signal as the monitoring clock signal XRESET. When the comparison result signal XSET at a high level is detected in the monitoring period TM, the pulse signal DETL changes from a high level to a low level, and the monitoring clock signal XRESET is again fixed at a high level.

4. Second Exemplary Configuration of Power Supply Circuit

A case has been described above where the output current IOUT of the power supply circuit 10 is kept constant as a result of the circuit device 100 performing feedback control, but the configuration may also be such that, as a result of the circuit device 100 performing feedback control, the output voltage of the power supply circuit 10 is kept constant.

Figure 8:
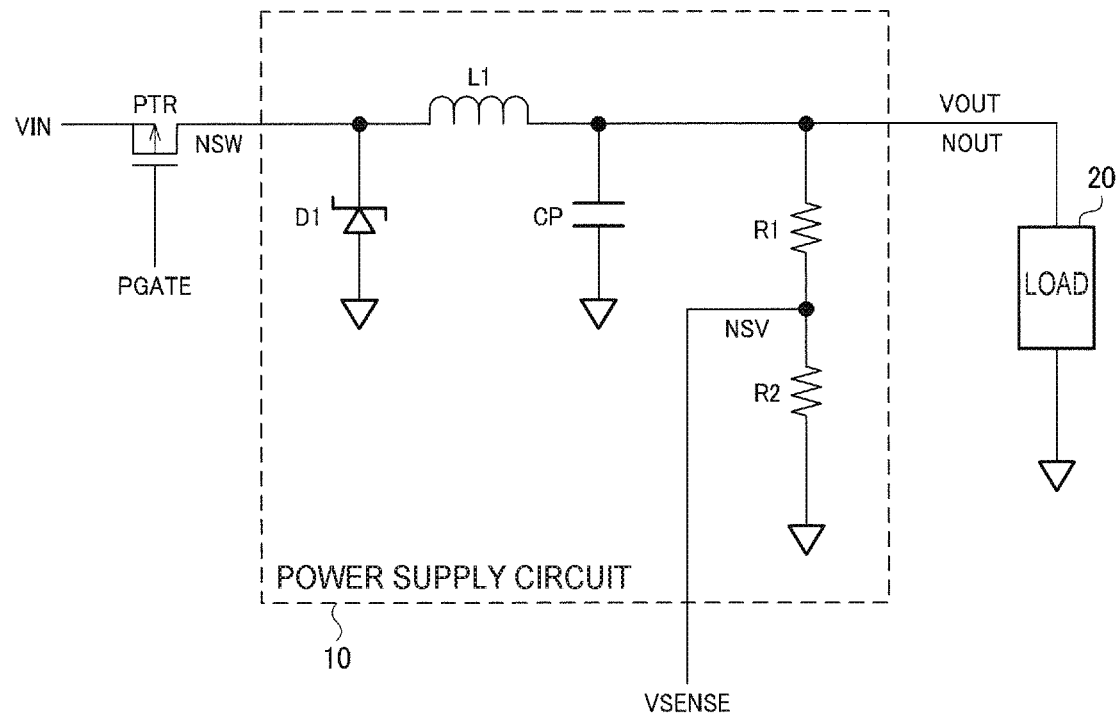
FIG. 8 shows a second exemplary configuration of a power supply circuit.

FIG. 8 is a second exemplary configuration of the power supply circuit 10, and in this exemplary configuration, the output voltage of the power supply circuit 10 is kept constant. The power supply circuit 10 includes an inductor L1, a diode D1, a capacitor CP, and resistors R1 and R2. The inductor L1, the diode D1, and the capacitor CP are similar to those in FIG. 1, and therefore the description thereof will be omitted.

In the power supply circuit 10 in FIG. 8, the load 20 and the resistors R1 and R2 are connected in parallel. That is, one end of the load 20 is connected to a node NOUT, and the other end is connected to ground. One end of the resistor R1 is connected to the node NOUT, and the other end is connected to a node NVS. One end of the resistor R2 is connected to the node NVS, and the other end is connected to ground. The resistors R1 and R2 voltage-divide the output voltage VOUT of the power supply circuit 10, and the voltage-divided voltage is output to the node NVS. The voltage at the node NVS is input to the circuit device 100 as the detection voltage VSENSE. The circuit device 100 performs feedback control such that the detection voltage VSENSE is kept constant. With this, feedback control is performed such that the output voltage VOUT is kept constant. The method of the feedback control is as described using FIGS. 1 to 7.

5. Electronic Apparatus

Figure 9:
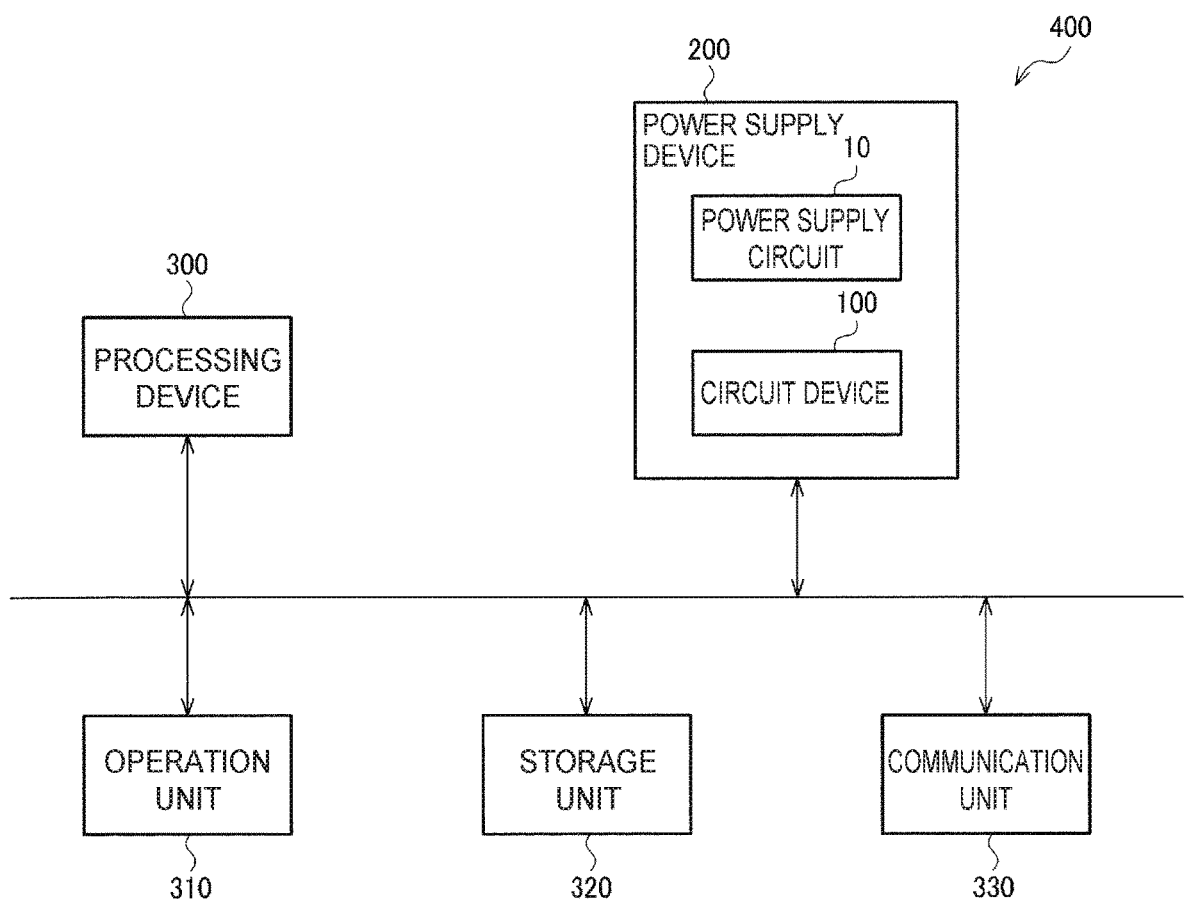
FIG. 9 shows an exemplary configuration of an electronic apparatus.

FIG. 9 shows an exemplary configuration of an electronic apparatus 400 including the circuit device 100. The electronic apparatus 400 includes a power supply device 200, a processing device 300, an operation unit 310, a storage unit 320, and a communication unit 330. The power supply device 200 includes the power supply circuit 10 and the circuit device 100. Note that the electronic apparatus 400 is not limited to the configuration in FIG. 9, and various modifications can be implemented such as omitting some of the constituent elements or adding other constituent elements. For example, in the electronic apparatus 400 that does not communicate with an external device, the communication unit 330 may be omitted.

Various electronic apparatuses including the switching power supply can be envisioned as the electronic apparatus 400. For example, the electronic apparatus 400 is an information processing device, a printing device, a projection device, a robot, a network-related apparatus, a measurement apparatus, a bio-information measurement apparatus, a video apparatus, an electrolyzed water generation device, or the like.

The power supply circuit 10 generates a DC voltage or a DC current from an input voltage, and outputs the DC voltage or the DC current to the units of the electronic apparatus 400, or to the outside of the electronic apparatus 400. The circuit device 100 performs feedback control on the power supply circuit 10 such that the DC voltage or the DC current is kept constant. The communication unit 330 communicate with an external device. The external device is an information processing device such as a PC, for example. The communication unit 330 may be a communication interface conforming to the USB standard, or a network interface such as LAN. The storage unit 320 stores data received from the communication unit 330. Also, the storage unit 320 may also function as a working memory of the processing device 300. The storage unit 320 is one or more of various storage devices such as a semiconductor memory and a hard disk drive. The operation unit 310 is a user interface for the user to operate the electronic apparatus 400. For example, the operation unit 310 is a button, a touch panel, a pointing device, a character input device, or the like. The processing device 300 is a processor such as a CPU or an MPU. The processing device 300 processes data stored in the storage unit 320.

The circuit device described in the embodiment described above includes a pulse signal output circuit and a driving circuit. The pulse signal output circuit performs comparison between a detection voltage and a reference voltage, and outputs a pulse signal based on a result of the comparison. The detection voltage is a voltage based on an output voltage or an output current of a power supply circuit that supplies power to a load through a switching element to which an input voltage is input. The driving circuit outputs a driving signal based on the pulse signal to the switching element. The pulse signal output circuit, when the detection voltage has decreased below the reference voltage, changes the pulse signal to the active level at which the switching element is turned on. The pulse signal output circuit performs, after the detection voltage has decreased below the reference voltage, monitoring as to whether or not the detection voltage has exceeded the reference voltage, and upon detecting that the detection voltage has exceeded the reference voltage, changes the pulse signal to the inactive level at which the switching element is turned off.

According to the present embodiment, when the detection voltage has decreased below the reference voltage, the switching element is turned on, and when it is detected that the detection voltage has exceeded the reference voltage in the monitoring thereafter, the switching element is turned off. With this, bottom detection hysteresis control is performed, and therefore a fast response to the change in load is possible compared with a case where linear control is performed using an error amplifier. Also, whether or not the detection voltage has exceeded the reference voltage is monitored, and therefore the on time of the switching element is adaptively changed according to the load. With this, optimum feedback control is performed on the power supply circuit, compared with a case where an on time fixed method is used.

Also, in the present embodiment, the pulse signal output circuit sets, when the detection voltage has decreased below the reference voltage, a non-monitoring period in which the monitoring is not performed. Thereafter, the pulse signal output circuit may repeat a monitoring period in which the monitoring is performed and the non-monitoring period.

It is possible that, immediately after the detection voltage has decreased below the reference voltage, an erroneous monitoring result is obtained due to noise or the like, and therefore it is possible that a failure occurs such as oscillation of a feedback loop. According to the present embodiment, the monitoring result is invalidated in the non-monitoring period after the detection voltage has decreased below the reference voltage, and the pulse signal is kept at the active level. With this, in a period immediately after the detection voltage has decreased below the reference voltage, the monitoring is not influenced by noise and the like, and the switching element is kept to be ON. Also, as a result of thereafter repeating the monitoring period and the non-monitoring period, when the detection voltage has exceeded the reference voltage, the switching element is turned off in the monitoring period. With this, the on time is variably controlled.

Also, in the present embodiment, the pulse signal output circuit may, after the detection voltage has decreased below the reference voltage, perform the monitoring in the monitoring period that is repeated at a predetermined cycle.

In this way, when the detection voltage has exceeded the reference voltage, the switching element is turned off in a monitoring period that is repeated at a predetermined cycle. With this, the on time is variably controlled with an interval of the predetermined cycle. Also, the minimum on time is one cycle of the predetermined cycle, and therefore the on time can be reduced compared with a case where an on time fixed method is used, and the ripple is reduced when the load is low.

Also, in the present embodiment, the predetermined cycle may be shorter than a switching interval of the switching element.

In the bottom detection hysteresis control, the output voltage or the output current of the power supply circuit is detected at switching intervals of the switching element. In known hysteresis control, a monitoring function at a cycle shorter than the switching interval is not implemented, and therefore the on time is fixed. In the present embodiment, monitoring is performed at the predetermined cycle that is shorter than the switching interval, and therefore the on time can be variably controlled.

Also, in the present embodiment, the pulse signal output circuit includes a clock signal output circuit. The clock signal output circuit outputs a monitoring clock signal at the predetermined cycle, in a period in which the pulse signal is in the active level. The pulse signal output circuit may perform the monitoring based on the monitoring clock signal.

In this way, as a result of the pulse signal output circuit 110 performing monitoring based on the monitoring clock signal at the predetermined cycle, the monitoring can be performed in a monitoring period that is repeated at a predetermined cycle that is shorter than the switching interval of the switching element.

Also, in the present embodiment, the pulse signal output circuit may include a comparator, a clock signal output circuit, and a holding circuit. The comparator may output a comparison result signal by comparing the detection voltage with the reference voltage. The clock signal output circuit may output a monitoring clock signal. The holding circuit may perform an operation of holding the pulse signal based on the comparison result signal and the monitoring clock signal. The holding circuit may change the pulse signal from the inactive level to the active level when the comparator has determined that the detection voltage has decreased below the reference voltage. The holding circuit may perform the monitoring as to whether or not the detection voltage has exceeded the reference voltage based on the comparison result signal, in a monitoring period in which the monitoring clock signal is at a first voltage level. The holding circuit may, when the comparator has determined that the detection voltage has exceeded the reference voltage in the monitoring period, change the pulse signal from the active level to the inactive level.

As a result of the holding circuit performing an operation of holding the pulse signal based on the comparison result signal and the monitoring clock signal, when the detection voltage has decreased below the reference voltage, the pulse signal is changed to the active level, the monitoring as to whether or not the detection voltage has exceeded the reference voltage is performed, and the pulse signal can be changed to the inactive level when it is detected that the detection voltage has exceeded the reference voltage.

Also, in the present embodiment, the holding circuit may include a set/reset circuit having a set terminal to which the comparison result signal is input, and a reset terminal to which the monitoring clock signal is input.

In this way, setting of the set/reset circuit is controlled based on the comparison result signal, and resetting of the set/reset circuit is controlled based on the monitoring clock signal. The holding circuit can monitor the comparison result signal in the monitoring period by using this fact. Specifically, the comparison result signal indicating that the detection voltage has exceeded the reference voltage is a signal for causing the set/reset circuit to enter a non-set state. Also, when the monitoring clock signal is at the first voltage level, the monitoring clock signal corresponds to a signal for resetting the set/reset circuit. When the set/reset circuit is in the non-set state and is reset by the monitoring clock signal, the set state of the set/reset circuit is released. This operation corresponds to the monitoring of the comparison result signal in the monitoring period, and as a result of releasing the set state, the pulse signal is changed to the inactive level.

Also, in the present embodiment, the clock signal output circuit may start outputting of the monitoring clock signal when the pulse signal has changed from the inactive level to the active level. The clock signal output circuit may end outputting of the monitoring clock signal when the pulse signal has changed from the active level to the inactive level.

In this way, in a period in which the pulse signal is at the active level, the clock signal output circuit outputs the monitoring clock signal, and the holding circuit can monitor the comparison result signal based on the monitoring clock signal. With this, after the detection voltage has decreased below the reference voltage, the monitoring as to whether or not the detection voltage has exceeded the reference voltage is performed.

Also, in the present embodiment, the circuit device may also include the switching element.

Also, a power supply device of the present embodiment may include any of the circuit devices described above and the power supply circuit.

Also, an electronic apparatus of the present embodiment may include any of the circuit devices described above.

Note that although an embodiment has been described in detail above, a person skilled in the art will readily appreciate that it is possible to implement numerous variations and modifications that do not depart substantially from the novel aspects and effect of the disclosure. Accordingly, all such variations and modifications are also to be included within the scope of the disclosure. For example, terms that are used within the description or drawings at least once together with broader terms or alternative synonymous terms can be replaced by those other terms at other locations as well within the description or drawings. Also, all combinations of the embodiment and variations are also encompassed in the range of the disclosure. Moreover, the configuration and operation of the circuit device, the power supply device, and the electronic apparatus, and the like are not limited to those described in the present embodiment, and various modifications are possible.

What is claimed is:

1. A circuit device comprising:
a pulse signal output circuit configured to perform comparison between a detection voltage and a reference voltage, the detection voltage being based on an output voltage or an output current of a power supply circuit that supplies power to a load, the power supply circuit is controlled through a switching element to which an input voltage is input, and output a pulse signal based on a result of the comparison, and the pulse signal output circuit including a clock signal output circuit that outputs, in a period in which the pulse signal is in an active level a monitoring clock signal at a predetermined cycle, and performs monitoring based on the monitoring clock signal; and
a driving circuit configured to output a driving signal based on the pulse signal to the switching element,
wherein the pulse signal output circuit,
when the detection voltage has decreased below the reference voltage, changes the pulse signal to the active level at which the switching element is turned on, and
after the detection voltage has decreased below the reference voltage, performs the monitoring as to whether or not the detection voltage has exceeded the reference voltage, and upon detecting that the detection voltage has exceeded the reference voltage, changes the pulse signal to an inactive level at which the switching element is turned off.

2. The circuit device according to claim 1,
wherein the pulse signal output circuit,
when the detection voltage has decreased below the reference voltage, after setting a non-monitoring period in which the monitoring is not performed, repeats a monitoring period in which the monitoring is performed and the non-monitoring period.

3. The circuit device according to claim 2,
the pulse signal output circuit,
after the detection voltage has decreased below the reference voltage, performs the monitoring in the monitoring period that is repeated at the predetermined cycle.

4. The circuit device according to claim 3,
wherein the predetermined cycle is shorter than a switching interval of the switching element.

5. The circuit device according to claim 1,
wherein the clock signal output circuit
starts outputting of the monitoring clock signal when the pulse signal has changed from the inactive level to the active level, and
ends outputting of the monitoring clock signal when the pulse signal has changed from the active level to the inactive level.

6. The circuit device according to claim 1, further comprising the switching element.

7. A power supply device comprising:
the circuit device according to claim 1; and
the power supply circuit.

8. An electronic apparatus comprising the circuit device according to claim 1.

9. A circuit device comprising:
a pulse signal output circuit configured to perform comparison between a detection voltage and a reference voltage, the detection voltage being based on an output voltage or an output current of a power supply circuit that supplies power to a load the power supply circuit is controlled through a switching element to which an input voltage is input, and output a pulse signal based on a result of the comparison; and
a driving circuit configured to output a driving signal based on the pulse signal to the switching element,
wherein the pulse signal output circuit,
when the detection voltage has decreased below the reference voltage, changes the pulse signal to an active level at which the switching element is turned on, and
after the detection voltage has decreased below the reference voltage, performs monitoring as to whether or not the detection voltage has exceeded the reference voltage, and upon detecting that the detection voltage has exceeded the reference voltage, changes the pulse signal to an inactive level at which the switching element is turned off
wherein the pulse signal output circuit includes:
a comparator that outputs a comparison result signal by comparing the detection voltage with the reference voltage;
a clock signal output circuit that outputs a monitoring clock signal; and
a holding circuit that performs an operation of holding the pulse signal based on the comparison result signal and the monitoring clock signal, and
the holding circuit
changes the pulse signal from the inactive level to the active level when the comparator has determined that the detection voltage has decreased below the reference voltage,
performs the monitoring as to whether or not the detection voltage has exceeded the reference voltage based on the comparison result signal, in a monitoring period in which the monitoring clock signal is at a first voltage level, and
when the comparator has determined that the detection voltage has exceeded the reference voltage in the monitoring period, changes the pulse signal from the active level to the inactive level.

10. The circuit device according to claim 9,
wherein the holding circuit includes a set/reset circuit having a set terminal to which the comparison result signal is input, and a reset terminal to which the monitoring clock signal is input.

11. The circuit device according to claim 9,
wherein the pulse signal output circuit,
when the detection voltage has decreased below the reference voltage, after setting a non-monitoring period in which the monitoring is not performed, repeats a monitoring period in which the monitoring is performed and the non-monitoring period.

12. The circuit device according to claim 11,
the pulse signal output circuit,
after the detection voltage has decreased below the reference voltage, performs the monitoring in the monitoring period that is repeated at a predetermined cycle.

13. The circuit device according to claim 12,
wherein the predetermined cycle is shorter than a switching interval of the switching element.

14. The circuit device according to claim 9,
wherein the clock signal output circuit
starts outputting of the monitoring clock signal when the pulse signal has changed from the inactive level to the active level, and
ends outputting of the monitoring clock signal when the pulse signal has changed from the active level to the inactive level.

15. The circuit device according to claim 9, further comprising the switching element.

16. A power supply device comprising:
the circuit device according to claim 9; and
the power supply circuit.

17. An electronic apparatus comprising the circuit device according to claim 9.

18. A circuit device comprising:
a pulse signal output circuit configured to perform comparison between a detection voltage and a reference voltage, the detection voltage being based on an output voltage or an output current of a power supply circuit that supplies power to a load, the power supply circuit is controlled through a switching element to which an input voltage is input, and output a pulse signal based on a result of the comparison; and
a driving circuit configured to output a driving signal based on the pulse signal to the switching element,
wherein the pulse signal output circuit,
when the detection voltage has decreased below the reference voltage, changes the pulse signal to an active level at which the switching element is turned on, and
after the detection voltage has decreased below the reference voltage, performs monitoring as to whether or not the detection voltage has exceeded the reference voltage, and upon detecting that the detection voltage has exceeded the reference voltage, changes the pulse signal to an inactive level at which the switching element is turned off,
wherein the pulse signal output circuit,
when the detection voltage has decreased below the reference voltage, after setting a non-monitoring period in which the monitoring is not performed, repeats a monitoring period in which the monitoring is performed and the non-monitoring period is performed at a predetermined cycle,
wherein the predetermined cycle is shorter than a switching interval of the switching element, and there is a plurality of predetermined cycles within a single switching interval of the switching element.

19. An electronic apparatus comprising the circuit device according to claim 18.

* * * * *